(12) United States Patent
Dornstetter

(10) Patent No.: US 10,057,010 B2
(45) Date of Patent: Aug. 21, 2018

(54) ERROR CORRECTION WITH TEST OF A PLURALITY OF LENGTHS FOR A DATA FRAME

(71) Applicants: GrDF, Paris (FR); SUEZ Groupe, Paris la Defense (FR)

(72) Inventor: Jean Louis Dornstetter, Choisel (FR)

(73) Assignee: GRDF, Paris (FR)

(*) Notice: Subject to any disclaimer, the term of this patent is extended or adjusted under 35 U.S.C. 154(b) by 42 days.

(21) Appl. No.: 15/108,219

(22) PCT Filed: Dec. 23, 2014

(86) PCT No.: PCT/FR2014/053532
§ 371 (c)(1),
(2) Date: Jun. 24, 2016

(87) PCT Pub. No.: WO2015/097404
PCT Pub. Date: Jul. 2, 2015

(65) Prior Publication Data
US 2016/0329988 A1 Nov. 10, 2016

(30) Foreign Application Priority Data
Dec. 26, 2013 (FR) .................................. 13 63578

(51) Int. Cl.
*H04L 1/00* (2006.01)
*G06F 11/10* (2006.01)
(Continued)

(52) U.S. Cl.
CPC ........ *H04L 1/0045* (2013.01); *G06F 11/1004* (2013.01); *H03M 13/09* (2013.01);
(Continued)

(58) Field of Classification Search
CPC ...... H03M 13/09; H03M 13/33; H03M 13/45; H04L 1/0041; H04L 1/0045; H04L 1/0038; H04L 1/0061; G06F 11/1004
See application file for complete search history.

(56) References Cited

U.S. PATENT DOCUMENTS 6,061,823 A 5/2000 Nara
7,020,209 B1* 3/2006 Okumura ............. H04L 1/0002
375/253
(Continued)

FOREIGN PATENT DOCUMENTS

EP 1819058 8/2007

OTHER PUBLICATIONS

International Search Report of International Application No. PCT/FR2014/053532 dated Feb. 26, 2015.
(Continued)

*Primary Examiner* — Shelly A Chase
(74) *Attorney, Agent, or Firm* — Finnegan, Henderson, Farabow, Garrett & Dunner, L.L.P.

(57) ABSTRACT

A method for receiving data frames which consists of determining a reference frame by firm decisions on the value of each bit received and then verifying the reference frame according to an integrity check code used for the transmission. The method may include the following steps: calculating, for each bit of said reference frame, a plausibility value that represents the probability of a transmission error; and, in the event of incompatibility with said integrity check code, identifying in said reference frame a non-empty finite set of the most plausibly erroneous bits in accordance with said plausibility values; listing candidate frames each corresponding respectively to one of the possible combinations of numbers of reversals of the identified most plausibly
(Continued)

erroneous bits; and verifying the compatibility of the listed candidate frames with said integrity check code.

13 Claims, 1 Drawing Sheet

(51) Int. Cl.
    *H03M 13/09*     (2006.01)
    *H03M 13/33*     (2006.01)
    *H03M 13/45*     (2006.01)
    *H04W 88/16*     (2009.01)

(52) U.S. Cl.
    CPC ....... *H03M 13/333* (2013.01); *H03M 13/453* (2013.01); *H04L 1/0038* (2013.01); *H04L 1/0041* (2013.01); *H04L 1/0061* (2013.01); *H04W 88/16* (2013.01)

(56) References Cited

U.S. PATENT DOCUMENTS

| | | | | |
|---|---|---|---|---|
| 7,609,724 | B1* | 10/2009 | Frederiks | H04J 3/1629 370/252 |
| 8,010,878 | B2* | 8/2011 | Okumura | H03M 13/09 375/253 |
| 8,171,291 | B2* | 5/2012 | Immonen | H04L 63/12 713/168 |
| 2006/0190798 | A1* | 8/2006 | Korkishko | G06F 11/08 714/758 |
| 2011/0162081 | A1* | 6/2011 | Lopez | H04L 9/3242 726/26 |

OTHER PUBLICATIONS

Ueda et al., "A Method of Improving Misframe for HEC-Based Variable Length Frame Suitable for IP Services," Electronics & Communications in Japan, Part I—Communications, Wiley, Hoboken, NJ, US, vol. 86, No. 6, Part 1, Jan. 2003 (Jan. 2003), pp. 46-58.

* cited by examiner

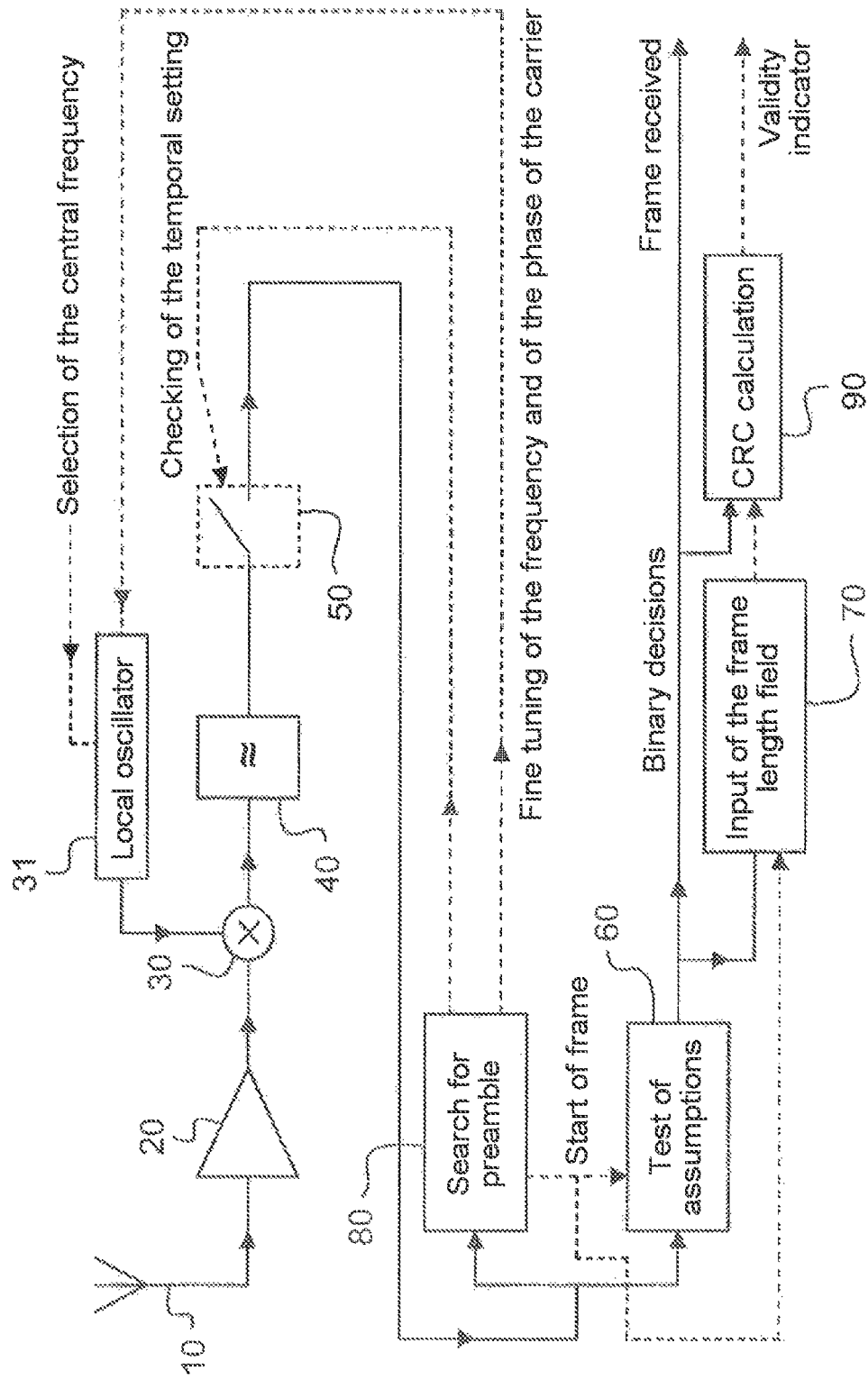

ERROR CORRECTION WITH TEST OF A PLURALITY OF LENGTHS FOR A DATA FRAME

CROSS REFERENCE TO RELATED APPLICATIONS

This application is a national stage entry of International Application No. PCT/FR2014/053532 filed on Dec. 23, 2014, and claims priority to and the benefit of the filing date of French Patent Application No. 1363578, filed on Dec. 26, 2013, the entire contents of which are incorporated by reference herein.

The present invention relates to a method for receiving digital data in which the data are transmitted by frames by using an integrity check coding of a frame transmitted, notably but not exclusively a cyclic redundancy check coding.

The invention is applicable in all cases where a digital signal is transmitted or broadcast over noisy channels. As an example, the present invention can be implemented in the receivers deployed in remote meter reading installations. A remote meter reading installation conventionally comprises a number of metering devices, for example water, gas, electricity meters or more generally fluid or energy meters, as well as gateway systems communicating on the one hand with the metering devices and on the other hand with an external telecommunications network.

The metering devices transmit metering data, for example water consumption data, to one or more gateway systems of the installation. Each gateway system transmits the metering data to the telecommunications network. The duly collected data can then be analyzed, for example in order to detect any leaks or other failures, and also for client billing purposes.

The metering devices comprise a fluid or energy consumption data metering module and a radiofrequency module for communicating with the neighboring gateway system or systems. This radiofrequency module can for example emit waves of relatively short range, for example at 169 MHz, or even at 433 MHz or 868 MHz.

A gateway system comprises a concentrator device, or collection enclosure, installed for example in a technical room of a building, and one or more radiofrequency transceiver devices, installed for example on the roof of the building, for communicating with the radiofrequency modules of the metering devices.

A remote meter reading installation thus employs digital transmission techniques that are well known and form the subject of standards published for example by the ETSI (European Telecommunications Standards Institute).

Generally, a digital transmission system conveys information by using a physical medium such as cable, optical fiber or propagation over a radiofrequency channel. Such a physical medium is referred to by the term channel. Conventionally, such a system requires a verification of the integrity of the frames received and, for this, comprises, in transmission, an integrity check coding, for example by means of cyclic redundancy check bits, making it possible to detect frame transmission errors. The integrity check coding function consists, for the transmitting device in a data transmission, in executing a calculation to create the check bits, attached to the transmitted data, which, during decoding in reception, will allow the receiver, from information arriving at destination, possibly affected by disturbances occurring in the channel, notably of noise, attenuation and interference type, and after having performed the same calculation, to verify the integrity of the frame received and thus determine whether the transmission can be considered to be correct or not.

In a remote meter reading installation as mentioned above making it possible to collect fluid or energy consumption data, each of the meters proceeds to transmit, at more or less regular intervals, data organized in frames, typically with a size of the order of a few tens of bytes. The main figure of merit of a receiver on the gateway system side in such an installation lies in its capacity to be able to correctly identify each of the frames transmitted by the different meters which will have been assigned to a given reception channel. Now, the very great variability of the propagation conditions between the meters and the gateway side receiver results in a very wide distribution of the energy actually collected from the transmitter of a frame. Also, because of the inevitable presence of additive noise, the performance of the receiver is measured by its capacity to receive frames in the presence of wideband additive noise, typically characterized by a frame length given in terms of bit error rate for a given signal-to-noise ratio, which depends crucially on the energy level per information bit actually collected as mentioned above.

A receiver conventionally performs the decoding of the error correcting code applied in transmission. When the transmission conditions are poor, that is to say for transmission conditions of low signal-to-noise ratio, the decoding method may not be able to correct all the errors affecting the frame received. According to the standard terminology, the events corresponding to the cases where a frame actually transmitted is not decoded correctly by the receiver are counted as errors of the first kind. In order to design an efficient receiver, it is of course best to seek to minimize the average rate of errors of the first kind (which is easy to define and to measure unambiguously for a given transmission channel disturbance scenario, such as the presence of additive white noise), in as much as the decoding of an errored frame will then have pointlessly strained the resources of the receiver, both in terms of energy consumed and in latency time.

However, this objective aiming to minimize the average rate of errors of the first kind happens to lead to the implementation of means which tend to increase the average frequency of the so-called errors of the second kind, relating to the events corresponding to the cases where the receiver is led to "invent" a frame allegedly correctly received whereas in reality no signal other than the disturbances of the channel deriving from the erratic fluctuations due to the noise and to the various spurious signals is present. These errors of the second kind do not by nature have any direct relationship with the transmission of frames, so it is customary to quantify them in the form of an average time between successive events rather than in the form of any rate or ratio. Be that as it may, such an error of the second kind, which is reflected in the untimely triggering of various mechanisms internal to the receiver, usually results from the combination of two factors, which are linked on the one hand to the decision to try to demodulate a frame following the detection of what appears to be a starter frame and, on the other hand, the classification as sufficiently plausible of the content of said candidate frame given the a priori knowledge of its structure.

Thus, it would be possible to consider minimizing the errors of the second kind by providing for the frame reception operations to be triggered only when the likelihood of the presence of a starter frame is sufficiently high given the signal received by the receiver. However, demanding in this case a higher value of said likelihood leads inevitably to increasing the probability of not satisfying these duly increased likelihood demands in the processing of signals representing a frame actually transmitted although received affected by disturbances such as additive noise or the like. Thus, the unavoidable result thereof is an undesirable increase in the errors of the first kind, which amounts to degrading the effective sensitivity of the receiver.

In practice, a trade-off has to be found between the contradictory objectives of minimizing the respective errors of the first and of the second kinds.

So, a problem which arises and that the present invention aims to resolve is to propose a method for receiving digital data, in particular in a remote meter reading installation, that makes it possible to obtain a very efficient error correction, while increasing the sensitivity of the receiver.

In order to resolve this problem, the present invention proposes a method for receiving digital data transmitted by frames using an integrity check coding by which, before a step of transmission of a frame over a channel, an additional frame validation information item created using said integrity check coding is added to the frame and, after said step of transmission over said channel, an estimation of the received frame is carried out by means of a decoding unit making it possible to determine a reference frame by firm decisions concerning the value of each bit received of a series of bits of length N considered and a verification of the compatibility of said reference frame supplied by the firm decisions is carried out with said integrity check coding used, said method being characterized in that it comprises steps consisting, for each frame received:

in calculating, for each bit of said reference frame supplied by the firm decisions, a value of likelihood of the value of the received bit representative of the probability of transmission error for the bits considered;

and, in case of non-compatibility of said reference frame with said integrity check coding:

in identifying in said reference frame a non-empty finite set of bits most likely errored as a function of said likelihood values calculated for each bit;

in listing a plurality of candidate frames each corresponding respectively to one of the possible combinations of a number of inversions of the bits most likely errored identified in said reference frame;

in verifying the compatibility of the candidate frames of said plurality of candidate frames listed with said integrity check coding;

in selecting a candidate frame compatible with said integrity check coding, said method further comprising steps consisting in receiving a first set of bits giving the length of the frame, in considering at least two candidate frame length values determined as a function of the likelihood values calculated for each bit of said first set of bits, and in carrying out the estimation of the frame received in ascending order of the frame lengths considered, in succession.

Concerning the application of the present invention to the field of remote meter reading, given the frame lengths considered, the typical number of members of the non-empty finite set discussed above is of the order of a few units, for example ranging from one to three or four.

According to one embodiment, the method comprises steps consisting in ordering the listing of each candidate frame in ascending order of their reliability and in ascending order of the number of inversions of the bits most likely errored identified in said reference frame and in iteratively verifying the compatibility of the duly ordered candidate frames, so as to stop the iterations as soon as a candidate frame is verified as compatible with said integrity check coding, whereby said selected candidate frame is that of the current iteration.

As a variant, the method can comprise steps consisting:

in determining, for each candidate frame of said plurality of candidate frames listed, a reliability score resulting from the sum of said likelihood values calculated for each bit, weighted as a function of the value of the corresponding bit in said candidate frame;

in selecting the candidate frame from said plurality of candidate frames listed which maximizes said reliability score while being compatible with said integrity check coding.

Preferably, said at least two candidate frame length values considered comprise a first candidate frame length value obtained by firm decisions concerning the value of each bit received of said first set of bits and a second candidate frame length value obtained by inversion of the bit most likely errored of said first set of bits.

Advantageously, the identification in said reference frame of said non-empty finite set of bits most likely errored consists in storing, from the start of reception of the frame, a set of information comprising at least the position of the bits concerned in the frame and the associated likelihood value and in updating said set of information after reception of each additional bit, said updating consisting in comparing the likelihood value associated with said additional bit received with the greatest in absolute value of the likelihood values previously stored, and in modifying said set of information, so as to replace the most reliable of the stored positions with the position of said additional bit received if the latter proves less reliable.

Preferably, said likelihood values calculated for each bit received result from the calculation of the logarithmic likelihood coefficient of the value of the bit received defined by the logarithm of the ratio of the conditional probability that the bit received is in a first state given the value of the bit received to the conditional probability that the bit received is in a second state given this same value of the bit received.

According to one embodiment, said integrity check coding is performed by a cyclic redundancy check coding.

As a variant, said integrity check coding is performed by a hashing algorithm.

Preferably, the method is implemented by a radiofrequency transceiver device of a gateway system in a remote meter reading installation further comprising a plurality of metering devices, each metering device comprising a metering module and a radiofrequency module for transmitting data to said radiofrequency transceiver device of said gateway system.

There is also proposed a computer program comprising instructions for performing the steps of the method according to the invention when these instructions are executed by a processor. This computer program can for example be stored on a memory medium of hard disk or other type, or even be downloaded, etc.

There is also proposed a device for receiving digital data comprising hardware and/or software means for implementing the method according to the invention.

In particular, there is proposed a device for receiving digital data transmitted by frames using an integrity check coding, of the type comprising a decoding unit arranged so as to supply as output firm decisions concerning the value of each bit received of a series of bits of length N considered, the set of said firm decisions constituting a reference frame corresponding to an estimation of a frame received, and a checking unit arranged to calculate a frame validation information item capable of supplying an indication of the compatibility of the frame received with said integrity check coding used, said device being characterized in that said decoding unit comprises:

means for calculating a value of likelihood of the value of the bit received representative of the probability of transmission error for each bit received of said reference frame, means for storing a non-empty finite set of bits most likely errored of said reference frame as a function of said likelihood values calculated for each bit, decision means arranged to list a plurality of candidate frames each corresponding respectively to one of the possible combinations of a number of inversions of the bits most likely errored, said checking unit being designed to verify the compatibility of the candidate frames of said plurality of candidate frames listed with said integrity check coding, said decision means being arranged to select a candidate frame compatible with said integrity check coding in order to estimate the frame received, said decoding unit being further suitable for receiving a first set of bits giving the length of the frame, considering at least two candidate frame length values determined as a function of the likelihood values calculated for each bit of said first set of bits, and in performing the estimation of the frame received in ascending order of the frame lengths considered, in succession.

The reception device can comprise a processor, for example a DSP (Digital Signal Processor), a microcontroller, a microprocessor or the like.

There is also proposed a gateway system for a remote meter reading installation, said gateway system comprising at least one radiofrequency transceiver device for communicating with a plurality of metering devices of said remote meter reading installation, said radiofrequency transceiver device comprising a reception device as described above.

There is also proposed a metering device for a remote meter reading installation of the type comprising a metering module arranged to measure fluid or energy consumption data, and a radiofrequency module for communicating with a radiofrequency transceiver device of a gateway system of said remote meter reading installation, said radiofrequency module comprising a reception device as described above.

There is also proposed a remote meter reading installation comprising a plurality of metering devices as described above and at least one gateway system as described above.

BRIEF DESCRIPTION OF THE DRAWINGS

Other features and advantages of the invention will emerge on reading the following description of a particular embodiment of the invention, given in an indicative but nonlimiting manner, with reference to the attached drawings in which:

FIG. 1 schematically illustrates an example of a functional architecture that can be implemented in a receiver implemented in a remote meter reading installation according to the invention.

DETAILED DESCRIPTION

A remote meter reading installation conventionally comprises an installed base of metering devices or meters. Each meter comprises a metering module arranged to measure a volume of water, a volume of gas, an electrical consumption or similar, and a radiofrequency module for communicating with a radiofrequency transceiver device of a gateway system of the installation. More generally, the metering modules of the metering device can be arranged to measure a fluid or energy consumption or the like, or even to measure a parameter value. The metering modules can for example comprise sensors, for example temperature, pressure, level or other sensors.

Conventionally, one or more gateway systems of the installation communicate, on the one hand, with the metering devices via one or more radiofrequency transceiver devices and, on the other hand, with an external telecommunication network via a hub device. Each gateway system transmits the metering data received from the metering devices to the external telecommunication network.

So as to better understand the method and the receiver according to the invention, the following description is given in an illustrative and nonlimiting manner for a remote meter reading installation arranged to collect meter status information using a so-called ISM frequency band defined in the standard EN 55011, situated in the vicinity of 169 MHz and using a narrow band transmission format based on a frequency modulation of an index close to 2 (representing the number of phase states) with a symbol rate of 2400 bits per second, which means that the frequency of the carrier radiated by a meter during its periods of activity is offset from its central value which characterizes the channel assigned to the meter, plus or minus 2.4 kHz during each period $T=1/2400$ second, corresponding to the transmission of a bit, the sign of the deviation depending on the value of said bit to be transmitted.

Before detailing an exemplary implementation of the method according to the invention, a few recaps concerning the waveform are explained. The frames emitted by the meters have a format that is known a priori by the receiver. The frame comprises, for example, a dedicated part for the synchronization of the frame and a number of parts relating to the useful information data to be transmitted. It thus comprises a preamble part formed by a few tens of bits on which the receiver performs, for example, a correlation which makes it possible to detect a start of frame upon the crossing of a threshold. The preamble part can also be used for the estimation of a few essential parameters following operations such as accurate time synchronization as well as the apparent center frequency such as results from the aggregate tuning errors of the local oscillators of the transmitter of the counter and of the receiver. The frame then comprises a length field typically of 8 bits, indicating the useful length N of the frame counted in bytes. Then, the frame comprises N bytes representing the useful information of the frame and finally cyclic redundancy check bits (CRC) typically coded on two bytes, relating to the length field and to the useful information content of the frame, i.e., on a total of N+1 bytes. Thus, the integrity check of the frame received relies in this example on the addition of two bytes calculated typically as the remainder of a binary polynomial division applying to the concatenation of the length field and of the useful information content of the frame.

Commonly, the use of two CRC bytes consists of a simple verification of the integrity of the frame received, such that a failure in this verification step on the receiver side indicates with certainty the existence of at least one error in the useful information part of the frame or in the two check bytes.

It should be noted that other integrity checking methods culminating in similar results are widely used in the field of telecommunications. Examples that can be cited include the addition of frame validation information involving so-called hashing functions such as, for example, those known by the names of MD5 and SHA-1. Be that as it may, it will be understood hereinbelow that the method of the invention is applicable to the reception of a frame provided that there is additional frame validation information, serving a similar purpose to that of the CRC bytes and which can be used via an appropriate calculation to probabilistically validate, the integrity of a frame and of said additional information.

The frame can also comprise, optionally, a constant post-amble indicating the end of the frame.

FIG. 1 illustrates a conventional functional architecture of a heterodyne receiver, on the basis of which the method of the invention can be implemented, it being understood that other typical architectures could also support the method of the invention and be the subject of modifications similar to those which will be described hereinbelow with reference to the receiver architecture according to the example of FIG. 1.

Thus, according to the example of FIG. 1, the signal transmitted is first of all picked up by an antenna 10 of the receiver, then transmitted to the analogue block of the reception chain, comprising a low noise amplifier (LNA) 20, a local oscillator 31 and a mixer 30. Since these elements do not have their operation modified in the context of the present invention, they will not be described in more detail.

It will simply be noted that the mixer 30, receiving on its first input the signal output from the LNA amplifier 20, receives on its second input, connected to the local oscillator 31, a frequency corresponding to the carrier frequency of the signal. This causes the signal to be brought into base band. The example given here is based on a redescent into base band, but is in no way limiting, it being understood that other current choices (such as the selection of a last low but non-zero intermediate frequency) could also be made. According to this example, there is therefore, at the output of the mixer 30, the binary message in continuous base band form, added to a high-frequency component centered on two times the carrier frequency. In effect, this demodulation operation reveals the spectral pattern of the base band signal, but also at two times the frequency of the carrier. Also, a low-pass filtering stage 40 at the output of the mixer 30 makes it possible to eliminate the harmonic distortion due to the redundancy of the spectrum in the demodulation of the signal. The filtered signal is then digitized by an analogue/digital converter 50 supplying a series of constituent bits of the received frame.

The data received by the receiver are generally noisy data. So, a decoding can be introduced at reception, to take into consideration the fact that some received data are more certain than others. Thus, for each series of bits considered, a decoding unit 60 called "hypothesis test" supplies as output a binary decision for each symbol period T (equal to 1/2400 second corresponding to the transmission of a bit in the context of the example given above). Such a decoding unit 60 makes it possible to take a firm decision relative to the value of an output bit, that is to say x=0 or else x=1, per incoming bit.

The flow of bits at the output is stored so as to enter the value of the length field of the received frame in a memory block 70 and a start-of-frame signal supplied by a block 80 for detecting the preamble of the frame is used to initialize a checking unit 90 designed to calculate the CRC for the ensuing frame. The result of the CRC calculation is added to the received bits to validate or not validate the content of the received frame sequentially.

As it has been indicated above, the two CRC bytes are therefore commonly exploited by proceeding with a simple verification of the assumed integrity of the received frame. It will easily be understood, all things otherwise being equal, that is to say with identical frame start detection and firm decision decoding performance levels, that such a use of the two CRC bytes makes it possible to limit the average number of times in which the receiver will be required to claim having received a frame when no such signal has been received. It has been seen that it was not desirable to target a reduction of these errors of the second kind by acting in particular on the value of a minimum trust threshold for the detection of the preamble of a frame, in as much as this type of modification leads to an undesirable increase in the errors of the first kind and, thereby, a reduction in the sensitivity of the receiver.

So, in accordance with the invention, the typical architecture of the receiver illustrated in FIG. 1 will be modified so as to obtain a shift of the trade-off between the two types of errors in the other direction. The sensitivity of the receiver will thus be prioritized and more frames will thus be received that are allowed to be processed, including errored frames, that is to say which do not satisfy the constraints induced by the CRC bytes, bearing in mind that, by proceeding according to the principles of the invention which will be detailed hereinbelow, the errors will be able to be processed in such a way as to limit the increase in the average frequency of errors of the second kind, normally expected in this context. In other words, the invention will make it possible to improve the level of correction on the errors of the first kind, by accepting a reasonable degradation in terms of errors of the second kind.

First, the decoding unit 60 is modified so as to supply as output not only the binary decision evolving from a firm decision taking concerning the value of the bit received during the corresponding symbol period, but also an accurate quantitative value of the degrees of conditional likelihood relating to the hypothesis that proves the most likely (namely the current bit x=0 or x=1). In other words, it is best to retain so called soft decisions unlike the firm decisions which are limited to a simple bit with the value 0 or 1.

Thus, the method consists firstly, for each series of bits considered, in calculating the value of a soft decision, this soft decision value representing the likelihood of the firm decision value previously mentioned.

The most conventional representation of a soft decision for a binary hypothesis test consists of the datum of the logarithmic likelihood coefficient defined by:

$$d = \log \frac{P(0 \mid r)}{P(1 \mid r)}$$

in which the vertical bar separates, according to the convention, the hypothesis considered of all the conditionally observables with which the probability is measured. Thus, the logarithmic likelihood coefficient d supplies a quantitative value of likelihood of the value of the bit received defined as the logarithm of the ratio of the conditional probability of the value of the bit x=0 conditional on the value r of the signal received to the conditional probability of the value of the bit x=1 conditional on this same received signal value r.

To illustrate the meaning of the expression of this quantitative likelihood value, consider a transmission system in which the signal transmitted is real and constant with the value $\pm\sqrt{E_b/T}$ over each time interval of a duration T, in which the sign depends on a useful information bit (the + sign being conventionally assigned to the "0" bits), the inverse of T representing the information bit rate in bits per second and $E_b$ being a constant number consistent with the energy assigned to the transmission of a bit. A noisy version of the signal transmitted is assumed available, the additive noise considered being assumed white and of bilateral spectral density NO. For this model of a transmission system with two phase states (usually called MDP2 or BPSK respectively in French and English literature), it is shown that:

the tests of each of the hypotheses relating to the successive bits are problems independent of one another;

a sufficient statistic for each of these successive problems is reduced to the evaluation of the average value r of the noisy signal received over the corresponding period of duration T;

the logarithmic likelihood ratio for the bit concerned is directly proportional to the single relevant observable r.

It will be observed that r is a random Gaussian variable of average $\pm\sqrt{E_b/T}$, the sign of said average depending on the bit transmitted, assigned an additive term of zero average and of variance $N_0T/2$.

The error rate per binary decision is therefore equal to the probability that the additive noise proves sufficiently great to lead to the observation of an average signal r which is of the sign opposite to that bit transmitted, which occurs with a probability p given for a "0" transmitted by the following expression:

$$p = P(r<0) = Q\left(\sqrt{2E_b/N_0}\right)$$

$$Q(x) \equiv \frac{1}{\sqrt{2\pi}} \int_{t=x}^{+\infty} e^{-t^2/2} dt$$

The function Q in the above expression is the "Gaussian tail" which gives the probability that a normal variable of 0 average and of unity standard deviation exceeds x, and the expression supplied for the bit error rate p obviously remains valid by symmetry when a "1" is transmitted.

The receiver according to the invention is thus designed to store the logarithmic likelihood coefficients of the values of each of the bits received of a series of bits considered. If it is accepted that the input of the length field N of the frame received supplies the correct value of the useful frame length, and that the frame comprises 16 CRC bits according to the example explained above, then the total number of relevant bits for N expressed in bytes is therefore M=8·N+16.

The receiver therefore carries out the calculation of the M logarithmic likelihood coefficients associated with the M bits, which will be denoted $r=\{r_1, \ldots, r_M\}$ hereinbelow. Given the statistical independence of the M decision problems already mentioned, the probability that the series of M bits actually transmitted is equal to a given vector $b=\{b_1, \ldots, b_M\}$ knowing what has been observed, namely r, is, according to the Bayes rule, an increasing function of the quantity:

$$s=b_1r_1+b_2r_2+\ldots+b_Mr_M \qquad (1)$$

an expression in which the hypotheses $b_i$ are represented in the form "+1" for a bit at 0 and "−1" for a bit at 1, according to a convention consistent with the assumed transmission format.

The most probable frame therefore corresponds to the choice of the vector b which maximizes the sum s which appears in the above expression (1). Obviously, the combination which maximizes s is that which ensures that each of the terms $b_ir_i$ is positive, which amounts to choosing $b_i$ according to the sign of the corresponding $r_i$. Such a combination is essentially unique except for considering that one or more of the values n proves zero, which corresponds to a total uncertainty as to the value of the corresponding bit $b_i$.

A conventional receiver proceeds, according to this choice, to estimate the frame received, in as much as this set of firm decisions formed by the vector b which maximizes the sum s, constitutes the only hypothesis out of the $2^M$ a priori possible combinations that can be envisaged. That is why the conventional receiver has no particular reason for preserving all of the values $r_i$ of logarithmic likelihood coefficients associated with the M bits received.

For a person skilled in the art, it was not at all obvious, or even predictable, that there could actually be a benefit in preserving all of these logarithmic likelihood coefficient values to validate hypotheses for the frame received other than that of the reference frame supplied by the series of bits corresponding to the firm decisions. There would in fact have been a busying of resources of the receiver to this end unnecessarily since the choice for the most probable frame of the reference frame corresponding to the firm decisions which maximizes the sum s is the logical and natural choice. In that, the invention has had to overcome a prejudice.

For all that, as soon as the reference frame formed by the series of bits corresponding to the firm decisions proves compatible with the integrity check coding employed, in this case according to the example, with the rule of calculation of the two cyclic redundancy bytes, in other words if the hypothesis concerning the duly estimated reference frame satisfies the CRC test, the receiver delivers the resulting frame to the outside world. Under this one condition, the behavior of the receiver according to the invention is identical to that of the conventional receiver.

The same does not however apply when the basic hypothesis relating to the frame formed from the set of firm decisions proves incompatible with the integrity check coding and therefore does not satisfy the constraints induced by the two CRC bytes. In such a case, it is certain that at least one of the bits supplied by the firm decisions is errored. It is then that the preservation of the values $r_i$ of logarithmic likelihood coefficients associated with the M bits received will make it possible, according to the invention, to consider other hypotheses for correcting the estimation of the frame received, and do so at the cost of a moderate additional computation effort, which will now be described in more detail.

In a first approach, it will be possible to consider compiling a list of the $L=2^M$ possible combinations for the frame received and sorting it according to the decreasing values of the corresponding sums according to the above expression (1). The estimation of the frame received with the likelihood maximum knowing the vector r available would consist in selecting the first entry in the sorted list concerned which is compatible with the integrity check coding used, and therefore which satisfies the known constraints induced by the rule of calculation of the cyclic redundancy bytes according to the example given above. Now, the order of magnitude for the list of the L possible combinations is such that it does not obviously allow for the effective construction of such a list.

In addition, another obstacle in practice is linked to the potentially very high number of candidate frames to be evaluated before finding one thereof which proves legitimate with regard to compatibility with the rule of calculation of the two redundancy bytes. This phenomenon is in reality intrinsic to the problem, and the fact that the first of the candidate frames which effectively satisfies the constraints linked to the redundancy bytes can very well be located at a very high rank position is unavoidable. It should also be noted that the frame that is most probable knowing the vector r available is supplied, thus reaching the value with the maximum likelihood for the rate of errors of the first kind. As discussed previously, this choice will inevitably lead to a possibly unacceptable increase in errors of the second kind.

Thus, two a priori unfavorable concerns are forced on those skilled in the art exploring the above approach, which are reflected on the one hand in the exorbitant cost in terms of computation resources and on the other hand in a manifestly unbalanced trade-off between the two contradictory objectives of reducing the respective errors of the first and second kinds, in which the processing of the first is done to the detriment of the second.

So, overcoming these prejudices, the invention proposes a method that is less costly and that can offer a more balanced trade-off between the processings of the two types of error, whereby provision is made to focus solely on the hypotheses likely to appear in a good position in the sorted list mentioned above. In other words, there will be listed a subset of reasonable size of candidate frames all a priori having good chances of appearing in a good position in the hypothetic sort of the gigantic list for which compiling the inventory will be refused for reasons of complexity, and the compatibility of these candidate frames with the rule of calculation of the two cyclic redundancy bytes will be examined.

It is clear in light of the above expression (1) that a candidate frame which differs from the reference frame formed by all the firm decisions $b_{i_j}=\text{signe}(r_{i_j})$ only in a few positions i for which the corresponding logarithmic likelihood coefficients $r_i$ are low, will obtain a reliability score which will be only moderately lower than the reference score which maximizes the sum s, namely $|r_1|+|r_2|+\ldots|r_M|$.

So, according to one embodiment, an effective method for listing the candidate frames consists, firstly, from the reference frame formed by the firm decisions $b_{i_j}=\text{signe}(r_{i_j})$ in selecting two integer parameters k≤m and in identifying the m lowest logarithmic likelihood coefficient values $r_i$ in absolute value. To put it another way, interest will be focused only on the bits most likely errored to correct them and thus the unreasonable increase in errors of the second kind will be avoided. The listing of the candidate frames then consists in sorting, preferentially in ascending order, the in lowest values $r_i$ in absolute value which have been identified, such that $|r_{i_1}|\leq|r_{i_2}|\leq|r_{i_3}|\ldots|r_{i_M}|$, and finally in listing all the possible combinations of a number of inversions c out of m positions $i_k$ preferentially beginning with the values of index k that are the lowest, overturning the firm decisions $b_{i_j}=\text{signe}(r_{i_j})$ for c values of out of m and retaining the firm decisions for the other bits in order to form a new candidate frame, and do so for a number of positions to be reversed c=0, 1, 2 … k.

Preferably, on each iteration of the above listing, the compatibility of the candidate frame of the current iteration with the rules of calculation of the cyclic redundancy check code is verified and the iterations are stopped as soon as a candidate frame tested proves legitimate, i.e. exhibits a CRC compatible with the rules in force.

Thus, according to this embodiment the process involves successive approximations by progressively eliminating the candidate frames listed according to the predefined arrangement in ascending order of their reliability and in ascending order of the number of inversions of the bits most likely errored and in conserving only a restricted range of hypotheses tending toward that which is optimal.

Below is an example illustrating this embodiment. Take the set of candidate frames considered for a frame received when the listing parameters are m=3, k=2. To lighten the notations, the only {bit positions} provided are those at which the candidate frame differs by complementing of the relevant bit of the reference frame supplied by the firm decisions. The three integers $i_1$ to $i_3$ denote the three least reliable bits of the frame received.

| Candidate frame | Number of inversions | Comments |
|---|---|---|
| { } | 0 | Begin with the reference frame |
| {$i_1$} | 1 | Inversion of the least reliable bit |
| {$i_2$} | 1 | Transition to the next bit |
| {$i_3$} | 1 | … |
| {$i_1$, $i_2$} | 2 | Inversion of 2 doubtful bits |
| {$i_1$, $i_3$} | 2 | … |
| {$i_2$, $i_3$} | 2 | Last candidate frame |

According to this embodiment, it should be noted that the order in which the candidate frames are examined can prove important given that the iterations are stopped at the first candidate frame which bears out the rules of calculation of the CRC bytes, it being understood that even for moderate values of the number of inversions c, several such candidate frames may prove legitimate, that is to say exhibit a compatible CRC. That is why it is desirable to perform the listing of the candidate frames according to the arrangement suggested above, consisting in beginning the listing of the candidate frames with the indexes k that are low, which correspond to the least reliable bits, and in listing the combinations with few inversions before those comprising many inversions, i.e. in iterating on the number of inversions c in ascending order.

It will be noted, however, that this does not guarantee that the candidate frames will be listed in descending resulting score order. Thus, considering the example above, if, for example, the third logarithmic likelihood coefficient exceeds, in absolute value, the sum of its two predecessors, i.e. if $|r_{i_3}|>|r_{i_1}|+|r_{i_2}|$, then, in this case, the fourth candidate frame {$i_3$} will exhibit a score lower than the fifth candidate frame {$i_1$, $i_2$}, but while being listed before, according to the arrangement retained above. So, starting from the unfavorable hypothesis in which the two candidate frames concerned would prove to exhibit a compatible CRC, the fact of delivering the candidate frame {$i_3$} as result of the estimation of the frame received by the receiver would lead to an error of the second kind (i.e. an errored frame), the first cause of which would be, here, a lack of wisdom on the part of the receiver rather than a "false start" of the receiver, in assuming that a genuine frame has effectively led to the triggering of the procedure described here.

So, a variant of the listing procedure described in the above embodiment consists, rather than stopping at the first legitimate candidate frame, in pushing the procedure of listing of the candidate frames to its conclusion, in storing, for each listed candidate frame, the corresponding reliability scores, then in next selecting the candidate frame exhibiting the highest reliability score out of the legitimate candidate frames.

It is assumed in the above that the length field of the frame was known reliably. Obviously, the bits which form the length field undergo the same deleterious effects due to the additive noise as the other bits of the frame, and are themselves likely to be affected by one or more errors. Given the fact that the value retained for the length field decisively influences the manner in which the conformity of the redundant information (in this case the two CRC bytes in the case of the format of the frame used in the meter status information collection installations according to the example given above) has to be calculated, it may be useful, to limit the losses, to extend the benefit of the final decision phase as to the useful information of the frame received to the length field itself.

To do this, provision is made to process the length field separately from the rest of the frame and to be restricted to two instances of the problem previously dealt with. Given the very small size in bits of the length field (typically 8 bits for the conventional transmission formats), there is no need to consider more than two candidate fields for the length field received, although considering more than two candidate values for the length field is in no way however excluded.

Thus, after the reception of the first 8 bits, two candidate values for the length field are considered, one corresponding to the 8 firm decisions, the other obtained by inversion of the least reliable bit of the 8 bits concerned. Let $N_1$ and $N_2$ be these two values, with $N_1<N_2$. The reception of the next $8 \cdot N_1+16$ bits is then carried out, by identifying the m lowest logarithmic likelihood coefficient values $r_i$ in absolute value, so as to proceed with a first execution of the process of selection of the candidate frame according to the principles explained above. In its simple variant whereby a valid frame is considered to have been received as soon as one of the listed candidate frames proves legitimate, i.e. proves compatible with the integrity check coding retained, the process effectively stops if one of the candidate frames is found to satisfy this required condition. If such is not the case, in other words if no legitimate candidate frame is identified, the second hypothesis retained for the length field must then be considered, namely the possibility that $N_2$ is the good candidate value for the length field instead of $N_1$ previously retained, and the reception phase is extended so as to collect the $N_2-N_1$ missing bits and the process of selection of the candidate frame is recommenced, based this time on the greater of the two frame lengths considered.

Ultimately, the present invention generates a minimal excess cost, which proves to be linked to the need to store a set of IV information items each representing one most likely errored, in other words least reliable, decisions received since the start of the frame, namely at least the rank of the bit concerned $i_j$ and the value of the associated logarithmic likelihood coefficient $r_{i_j}$. The updating of this set of information after reception of an additional bit comprises elementary operations aiming to compare the logarithmic likelihood coefficient of the last bit received with the greatest in absolute value of the m values preserved, and in reorganizing the set concerned so as to keep this set of m lowest values received processed sequentially. An embodiment for performing this updating may consist in retaining an image of these m least reliable values, arranged by increasing values of their associated logarithmic likelihood coefficient (or decreasing), the updating on reception of a new element then comprising the comparison with the last element (ascending sort) or the first element (descending sort) and, if necessary, the acceptance of the new element and the insertion thereof at the correct rank so as to preserve the ordered nature of the updated set.

There now follows a description of a preferred embodiment for the calculation of a CRC in order to proceed with the evaluation of the CRC of the different candidate frames corresponding to the different firm decision inversion attempts. To this end it is important first of all to detail the nature of the calculation of a 16-bit CRC according to the format retained in the example cited above of meter status information collection installation.

n denotes the total number of bits involved in the calculation of the CRC, i.e. $n=8+8 \cdot N$, where N is the assumed value of the length field given by the first 8 bits, such that the calculation of the remainder, which constitutes the core of the integrity check coding algorithm, consists in performing a Euclidian division as indicated below:

$$g(x)x^{16}+x^{12}+x^5+1$$

$$i(x)=(x^{16}+1)/(x+1)=x^{15}+x^{14}+x^{13}+\ldots+x^2+x+1$$

$$d_j(x)=x^j i(x)+b_1 x^{j-1}+b_2 x^{j-2}+\ldots+b_{j-1}x+b_j$$

$$d_j(x)=q_j(x)g(x)+c_j(x), \deg(c_j)<\deg(g)=16 \qquad (2)$$

All the polynomials considered here have coefficients in the body with two elements $\{0, 1\}$ provided with the usual modulo 2 arithmetic operations. The polynomial g in the formal variable x is the generator of the underlying cyclic code, the polynomial $d_j$ represents the j first incoming binary data for which the CRC represented by the remainder $c_j$ of the standard Euclidian division on the binary body with two elements defined by the fourth line of the above equation (2) is to be calculated, it being understood that the value of the quotients q is of no particular interest, only the remainder $c_n$ representing the 16 bits of the final result after assimilation of all the bits. The constant polynomial i(x) serves as an additive constant whose effect is to assign the final result, such that none of the two particular series of information $\{b_j\}$ formed exclusively by to zeros and n ones, respectively, provides a remainder c which is itself formed exclusively by zeros or ones. Although the equation (2) mentions all the intermediate results, only the final value when $j=n$ is of interest.

The calculation of the remainder $c_j$ can be done in practice iteratively as follows. A register c of 16 bits (that will be represented here with the coefficients of the powers of x that are high on the left/first) is initialized with the value 1111111111111111, which corresponds to the constant i(x). The register c concerned represents the value of the intermediate result $c_j$ after having received j bits, and the above initial value corresponds to $j=0$.

Next, for the successive values of the index ranging from 1 to n, the contribution of the bit $b_j$ is incorporated by proceeding as follows: $c_j$ is multiplied by x, which amounts to a shift to the left by one slot, and the polynomial $b_j x^0$ is added to it which amounts to replacing the righthand bit of the register $c_j$ with the incoming bit $b_j$. If this intermediate result comprises a term at $x^{16}$ that is non-zero, the polynomial g is added (in the sense of the body with two elements) to $c_j$ so as to cancel this term at $x^{16}$ and maintain the desired property $\deg(c_j)<16$. This addition is done in practice by an operation of bit-by-bit exclusive-OR type between the register $c_j$ shifted by 1 bit to the left and the constant g represented as (1)0001000000100101, in which the coefficient at $x^{16}$, which is not involved given that the register $c_j$ needs only 16 bits, is indicated between brackets.

It is very easy to verify, by recurrence on the index j, that the value updated according to this method of $c_j$ is indeed that defined by the equation (4), such that after n such operations, the result c is indeed the desired CRC.

It is possible to add to each of the preserved m information items, which characterize the m least reliable binary positions encountered up to the current position, a 16-bit register which supplies the change of the final result $c_n$ (in the form of bit-by-bit exclusive-ors relating to the 16 binary positions) assuming that the corresponding firm decision would have to be inverted.

The corresponding 16-bit register should then be initialized with the constant value 0000000000000001 when the current logarithmic likelihood coefficient $r_j$ is sufficiently low in absolute value to rejoin the subset of the least reliable positions that is preserved for the final decision phase. The m 16-bit registers corresponding to any changes of the final CRC upon the assimilation of the remaining incoming data should also be updated.

The active phase of listing the hypotheses on the final frame can then be reduced to very simple operations aiming to modify the CRC of the reference frame via simple operations of exclusive-or type over 16 bits with a subset of the least reliable bits for which there is a desire to overturn the reference firm decision.

The invention claimed is:
1. A method for receiving digital data transmitted by frames using an integrity check coding, the integrity check coding comprising:
   a step of adding an additional frame validation information item created using the integrity check coding to a frame before a step of transmitting the frame over a channel;
   a step of estimating the frame by means of a decoding unit to determine a reference frame by firm decisions concerning the value of each bit received of a series of bits of length N considered after the step of transmitting the frame over the channel; and
   a step of verifying a compatibility of the reference frame with the integrity check coding;
   the method comprising, for each frame received:
      calculating, for each bit of the reference frame, a value of likelihood of the value of the bit representative of the probability of transmission error for the bits considered; and
      when the reference frame and the integrity check coding are incompatible:
         identifying in the reference frame a non-empty finite set of bits most likely errored as a function of the likelihood values calculated for each bit;
         listing a plurality of candidate frames each corresponding respectively to one of the possible combinations of a number of inversions of the bits most likely errored identified in the reference frame;
         verifying the compatibility of the candidate frames of the plurality of candidate frames listed with the integrity check coding; and
         selecting a candidate frame compatible with the integrity check coding,
      the method further comprising steps of:
         receiving a first set of bits giving the length of the frame;
         considering at least two candidate frame length values determined as a function of the likelihood values calculated for each bit of the first set of bits; and
         estimating the frame in ascending order of the at least two candidate frame lengths considered, in succession.

2. The method as claimed in claim 1, further comprising:
   ordering the listing of each candidate frame in ascending order of their reliability and in ascending order of the number of inversions of the bits most likely errored and identified in the reference frame; and
   iteratively verifying the compatibility of the ordered candidate frames, so as to stop the iterations as soon as a candidate frame is verified as compatible with the integrity check coding, whereby the selected candidate frame is that of the current iteration.

3. The method as claimed in claim 1, further comprising:
   determining, for each candidate frame of said plurality of candidate frames listed, a reliability score resulting from the sum of the likelihood values calculated for each bit, weighted as a function of the value of the corresponding bit in the candidate frame;
   selecting the candidate frame from said plurality of candidate frames listed which maximizes the reliability score while being compatible with said integrity check coding.

4. The method as claimed in claim 1, wherein the at least two candidate frame length values comprise a first candidate frame length value obtained by firm decisions concerning the value of each bit received of said first set of bits and a second candidate frame length value obtained by inversion of the bit most likely errored of said first set of bits.

5. The method as claimed in claim 1, wherein the identification in the reference frame of the non-empty finite set of bits most likely errored comprises;
   storing, from the start of reception of the frame, a set of information comprising at least the position of the bits concerned in the frame and the associated likelihood value;
   updating the set of information after reception of each additional bit, the updating including comparing the likelihood value associated with the additional bit received with the greatest in absolute value of the likelihood values previously stored; and
   modifying said set of information, so as to replace the most reliable of the stored positions with the position of said additional bit received if the latter proves less reliable.

6. The method as claimed in claim 1, wherein the likelihood values calculated for each bit received result from the calculation of the logarithmic likelihood coefficient of the value of the bit received, the logarithmic likelihood coefficient being defined by the logarithm of the ratio of the conditional probability that the bit received is in a first state given the value of the bit received to the conditional probability that the bit received is in a second state given this same value of the bit received.

7. The method as claimed in claim 1, wherein the integrity check coding is performed by a cyclic redundancy check coding.

8. The method as claimed in claim 1, wherein the integrity check coding is performed by a hashing algorithm.

9. The method as claimed in claim 1, wherein the method is implemented by a radiofrequency transceiver device of a gateway system in a remote meter reading installation, the remote meter reading system comprising a plurality of metering devices, each metering device comprising a metering module and a radiofrequency module for transmitting data to the radiofrequency transceiver device of the gateway system.

10. A reception device for receiving digital data transmitted by frames using an integrity check coding, the device comprising:

a decoding unit configured to supply as output firm decisions concerning the value of each bit received of a series of bits of length N considered, the set of said firm decisions constituting a reference frame corresponding to an estimation of a frame received, and a checking unit arranged to calculate a frame validation information item configured to supply an indication of the compatibility of the frame received with the integrity check coding;

the decoding unit comprising:

means for calculating a value of likelihood of the value of the bit received representative of the probability of transmission error for each bit received of the reference frame, means for storing a non-empty finite set of bits most likely errored of the reference frame as a function of the likelihood values calculated for each bit, and decision means arranged to list a plurality of candidate frames each corresponding respectively to one of the possible combinations of a number of inversions of the bits most likely errored, the checking unit being configured to verify the compatibility of the candidate frames of the plurality of candidate frames listed with the integrity check coding, the decision means being configured to select a candidate frame compatible with the integrity check coding in order to estimate the frame received, and the decoding unit being configured to:

receive a first set of bits giving the length of the frame, consider at least two candidate frame length values determined as a function of the likelihood values calculated for each bit of the first set of bits, and estimate the frame received in ascending order of the frame lengths considered, in succession.

11. The reception device of claim 10, wherein the reception device is connected to a gateway system for a remote meter reading installation, the gateway system comprising at least one radiofrequency transceiver device for communicating with a plurality of metering devices of the remote meter reading installation, the radiofrequency transceiver device comprising the reception device.

12. The reception device of claim 10, wherein the reception device is connected to a metering device for a remote meter reading installation, the metering device comprising a metering module and a radiofrequency module for communicating with a radiofrequency transceiver device of a gateway system of the remote meter reading installation, the radiofrequency module comprising the reception device.

13. A remote meter reading installation, comprising:

a plurality of metering devices, each metering device comprising a metering module and a radiofrequency module for communicating with a radiofrequency transceiver device of a gateway system of the remote meter reading installation, the radiofrequency module comprising a first reception device; and at least one gateway system comprising at least one radiofrequency transceiver device for communicating with a plurality of metering devices of the remote meter reading installation, the radiofrequency transceiver device comprising a second reception device;

wherein each of the first reception device and the second reception device comprises:

a decoding unit configured to supply as output firm decisions concerning the value of each bit received of a series of bits of length N considered, the set of said firm decisions constituting a reference frame corresponding to an estimation of a frame received, and a checking unit arranged to calculate a frame validation information item configured to supply an indication of the compatibility of the frame received with the integrity check coding;

the decoding unit comprising:

means for calculating a value of likelihood of the value of the bit received representative of the probability of transmission error for each bit received of the reference frame, means for storing a non-empty finite set of bits most likely errored of the reference frame as a function of the likelihood values calculated for each bit, and decision means arranged to list a plurality of candidate frames each corresponding respectively to one of the possible combinations of a number of inversions of the bits most likely errored, the checking unit being configured to verify the compatibility of the candidate frames of the plurality of candidate frames listed with the integrity check coding, the decision means being configured to select a candidate frame compatible with the integrity check coding in order to estimate the frame received, and the decoding unit being configured to:

receive a first set of bits giving the length of the frame, consider at least two candidate frame length values determined as a function of the likelihood values calculated for each bit of the first set of bits, and estimate the frame received in ascending order of the frame lengths considered, in succession.

* * * * *